United States Patent
Lee et al.

(10) Patent No.: US 11,618,674 B2
(45) Date of Patent: Apr. 4, 2023

(54) ACTUATOR LAYER PATTERNING WITH TOPOGRAPHY

(71) Applicant: InvenSense, Inc., San Jose, CA (US)

(72) Inventors: Daesung Lee, San Jose, CA (US); Alan Cuthbertson, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 90 days.

(21) Appl. No.: 17/195,346

(22) Filed: Mar. 8, 2021

(65) Prior Publication Data

US 2022/0106188 A1  Apr. 7, 2022

Related U.S. Application Data

(60) Provisional application No. 63/198,251, filed on Oct. 6, 2020.

(51) Int. Cl.
*B81C 1/00* (2006.01)
*B81B 7/00* (2006.01)

(52) U.S. Cl.
CPC ........ *B81C 1/00095* (2013.01); *B81B 7/0006* (2013.01); *B81B 2207/012* (2013.01); *B81B 2207/07* (2013.01); *B81C 2201/014* (2013.01); *B81C 2201/0198* (2013.01); *B81C 2203/036* (2013.01); *B81C 2203/0792* (2013.01)

(58) Field of Classification Search
CPC .......... B81C 1/00095; B81C 2201/014; B81C 2201/0198; B81C 2203/036; B81C 2203/0792; B81C 1/00238; B81C 1/00388; B81C 1/00396; B81B 7/0006; B81B 2207/012; B81B 2207/07; B81B 2203/0323–0353
See application file for complete search history.

(56) References Cited

U.S. PATENT DOCUMENTS

| 10,745,270 B2 | 8/2020 | Lee et al. |
| 2014/0206123 A1 | 7/2014 | Chu et al. |
| 2015/0097215 A1* | 4/2015 | Chu ............... B81C 1/00277 438/51 |
| 2015/0357375 A1* | 12/2015 | Tsai ................ H01L 41/1132 257/416 |

OTHER PUBLICATIONS

PCT International Search Report and Written Opinion, dated Nov. 5, 2021 for PCT/US2021/045428. 80 pages.

* cited by examiner

*Primary Examiner* — Shahed Ahmed
*Assistant Examiner* — Sun Mi Kim King

(57) ABSTRACT

A method including fusion bonding a handle wafer to a first side of a device wafer. The method further includes depositing a hardmask on a second side of the device wafer, wherein the second side is planar. An etch stop layer is deposited over the hardmask and an exposed portion of the second side of the device wafer. A dielectric layer is formed over the etch stop layer. A via is formed within the dielectric layer. The via is filled with conductive material. A eutectic bond layer is formed over the conductive material. Portions of the dielectric layer uncovered by the eutectic bond layer is etched to expose the etch stop layer. The exposed portions of the etch stop layer is etched. A micro-electro-mechanical system (MEMS) device pattern is etched into the device wafer.

16 Claims, 17 Drawing Sheets

ACTUATOR LAYER PATTERNING WITH TOPOGRAPHY

CROSS-REFERENCE TO RELATED APPLICATIONS

This application claims the benefit of U.S. Provisional Patent Application Ser. No. 63/198,251 filed Oct. 6, 2020, entitled "ACTUATOR LAYER PATTERNING WITH TOPOGRAPHY."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is a method including fusion bonding a handle wafer to a first side of a device wafer. The method further includes depositing a hardmask on a second side of the device wafer, wherein the second side is planar. An etch stop layer is deposited over the hardmask and an exposed portion of the second side of the device wafer. A dielectric layer is formed over the etch stop layer. A via is formed within the dielectric layer. The via is filled with conductive material. A eutectic bond layer is formed over the conductive material. Portions of the dielectric layer uncovered by the eutectic bond layer is etched to expose the etch stop layer. The exposed portions of the etch stop layer is etched. A micro-electro-mechanical system (MEMS) device pattern is etched into the device wafer.

Provided herein is another method including fusion bonding a handle wafer to a first side of a device wafer. A hardmask is deposited on a second side of the device wafer, wherein the second side is planar. A dielectric layer is deposited over the hardmask and an exposed portion of the second side of the device wafer. A via is formed within the dielectric layer. The via is filled with conductive material. A eutectic bond layer is formed over the conductive material. Portions of the dielectric layer uncovered by the eutectic bond layer is etched to expose the hardmask. A micro-electro-mechanical system (MEMS) device pattern is etched into the device wafer.

Provided herein is a device including a handle wafer and a device wafer having a first side that is opposite to a second side, wherein the first side of the device wafer is fusion bonded to the handle wafer. The second side of the device wafer has a first portion and a second portion, wherein the second portion comprises a dielectric layer including a via formed therein, and wherein the via is filled with conductive material, and wherein the second portion of the second side of the device wafer further includes a eutectic bond layer formed on the dielectric layer and further on the via and the conductive material.

These and other features and advantages will be apparent from a reading of the following detailed description.

DESCRIPTION

Figure 1:
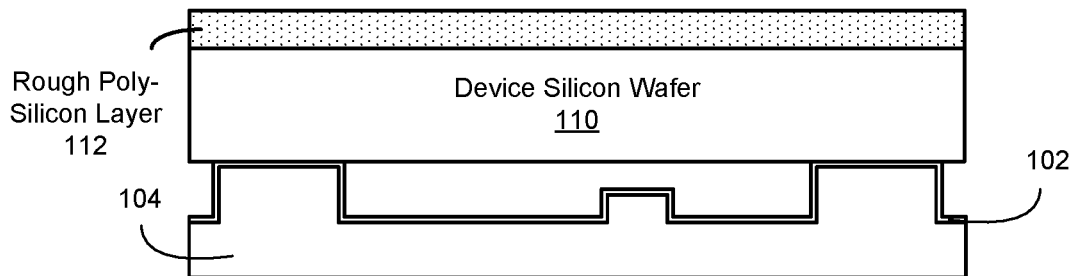
FIG. 1 shows a MEMS wafer at an early stage of manufacture according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

The existence of standoffs in MEMS sensors causes non-uniform thicknesses of photoresist, leading to lithography variations. Previous solutions have focused on increasing the distance between standoffs and key MEMS features, however these solutions increase the die size. Other solutions have focused on reducing the standoff height, however these solutions have used larger standoffs on the bond pair, thereby increasing the processing complexity of corresponding complementary metal-oxide semiconductor ("CMOS") wafers. In yet other solutions a hard mask coated on the MEMS surface is used during fabrication in order to reduce the distance between the conductive standoffs and key MEMS features. That hard mask is used to create a planar topography in order to reduce or prevent photoresist buildup around the standoffs. Conductive standoffs (e.g. polysilicon) require the deposition of the thick standoff layer and doping. An alternative approach is to use a nonconductive standoff (e.g. oxide) but yet to form a via therein to provide the desired electrical connection. It is desirable to use the nonconductive layer in comparison to the conductive layer to form the thick standoff layer in terms of the manufacturability.

Referring now to FIG. 1, a MEMS wafer at an early stage of manufacture according to one aspect of the present embodiments is shown. In some embodiments, a fusion bond oxide 102 fusion bonds a handle silicon wafer 104 to a first side of a device silicon wafer 110 (may also be referred to as the actuator layer). A second side of the device silicon wafer 110 is planar and opposite the first side. In some embodiments, a rough polysilicon layer 112 is deposited on the second side of the device silicon wafer 110. In some embodiments, the rough polysilicon layer 112 is deposited directly on the second side of the device silicon wafer 110. It is appreciated that the rough polysilicon layer 112 is optional and it improves stiction. In other embodiments, the rough polysilicon layer 112 may be absent. It is appreciated that the rough polysilicon layer 112 may be substituted with a different material in order to improve stiction. In other embodiments, the partial etch step is added on the rough polysilicon to increase the roughness. It is appreciated that this step is optional and it improves stiction further. In other embodiments, the device silicon is patterned to provide the macroscopic topography (e.g. dimple) prior to the rough polysilicon deposition. It is appreciated that this step is optional and it improves stiction further.

Figure 2:
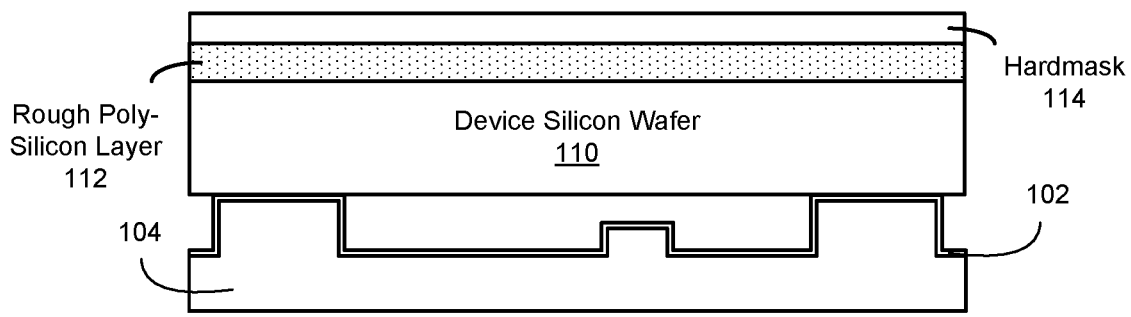
FIG. 2 shows the MEMS wafer after hardmask deposition according to one aspect of the present embodiments.

FIG. 2 shows the MEMS wafer after hardmask deposition according to one aspect of the present embodiments. A hardmask 114 is deposited on the second side of the device silicon wafer 110. In various embodiments the hardmask 114 includes oxide and is a different material than the device silicon wafer 110. In some embodiments, the hardmask 114 is deposited directly on the rough polysilicon layer 112 that covers the second side of the device silicon wafer 110.

Figure 3:
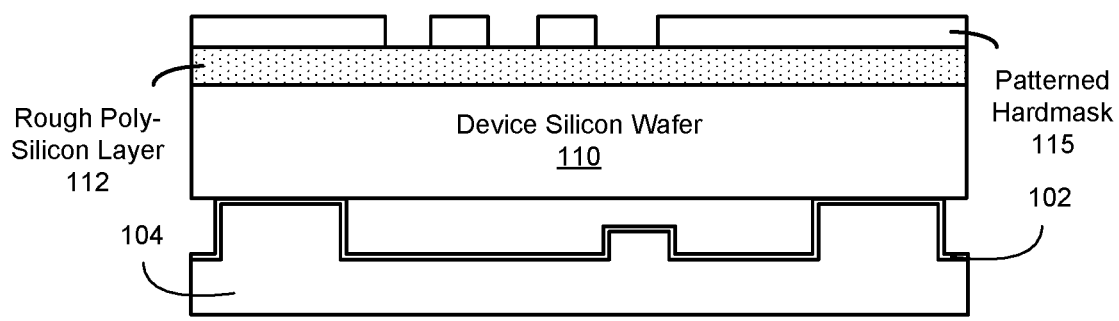
FIG. 3 shows the MEMS wafer after patterning the hardmask according to one aspect of the present embodiments.

FIG. 3 shows the MEMS wafer after patterning the hardmask according to one aspect of the present embodiments. The hardmask 114 is etched to form a patterned hardmask 115 that corresponds to MEMS device pattern. The etching of the hardmask 114 etches the full thickness of the hardmask 114, thereby exposing portions of the rough polysilicon layer 112.

Figure 4:
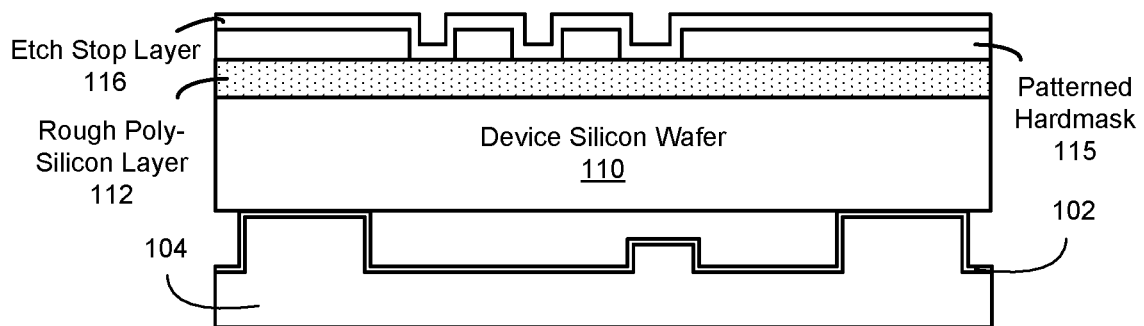
FIG. 4 shows the MEMS wafer after etch stop layer deposition according to one aspect of the present embodiments.

FIG. 4 shows the MEMS wafer after etch stop layer deposition according to one aspect of the present embodiments. An etch stop layer 116 is deposited over the patterned hardmask 115 and the exposed portions of the rough polysilicon layer 112. It is appreciated that use of the etch stop layer 116 may be eliminated by using a different material for the hardmask 114 layer and the standoff that is formed in a later stage (as discussed in other embodiments). It is appreciated that the etch stop layer 116 may include nitride, oxy-nitride, or poly-silicon.

Figure 5:
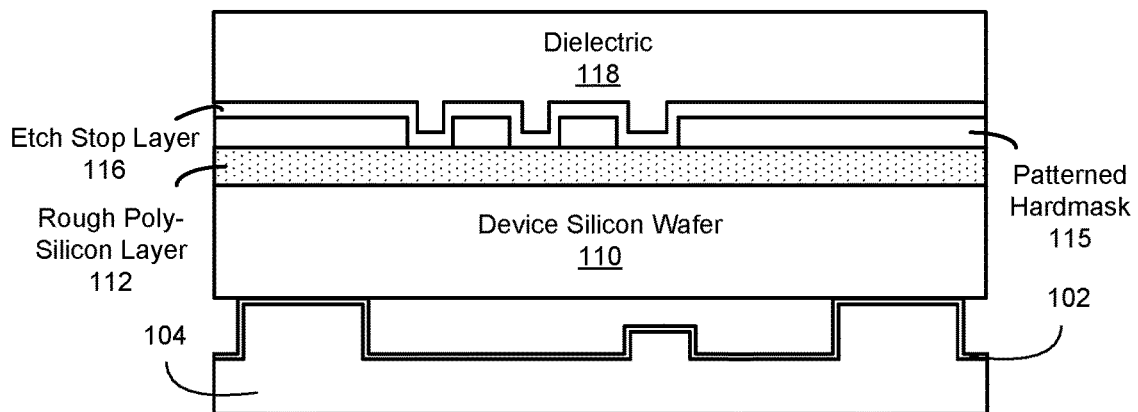
FIG. 5 shows the MEMS wafer after formation of a dielectric layer over the etch stop layer according to one aspect of the present embodiments.

FIG. 5 shows the MEMS wafer after formation of a dielectric layer over the etch stop layer according to one aspect of the present embodiments. A dielectric 118 is deposited over the etch stop layer 116. The dielectric 118 is used to form a standoff (discussed later below). The dielectric 118 may include a material similar to the hardmask 114. It is appreciated that as described above, the etch stop layer 116 may be eliminated if the hardmask 114 and the dielectric 118 are formed from different material (described in an embodiment later in this application). It is appreciated that the dielectric 118 may be deposited to form the standoff using plasma-enhanced chemical vapor deposition (PECVD)-oxide. In some embodiments, the dielectric 118 is optionally planarized through a chemical mechanical polishing process. In other embodiments, the additional dielectric deposition and planarization through a chemical mechanical polishing process is optionally added prior to the deposition of the dielectric 118. The advantage is to better control the thickness of the dielectric 118 in comparison to adding a chemical mechanical polishing process after the deposition of the dielectric 118.

Figure 6:
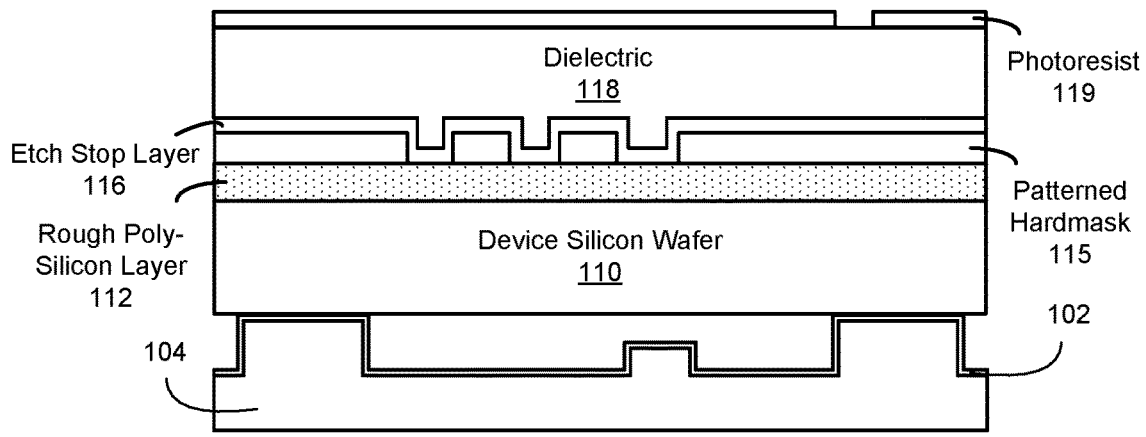
FIG. 6 shows the MEMS wafer after deposition of a photoresist over the dielectric layer according to one aspect of the present embodiments.

FIG. 6 shows the MEMS wafer after deposition of a photoresist over the dielectric layer according to one aspect of the present embodiments. A photoresist 119 is deposited over the dielectric 118 and patterned.

Figure 7:
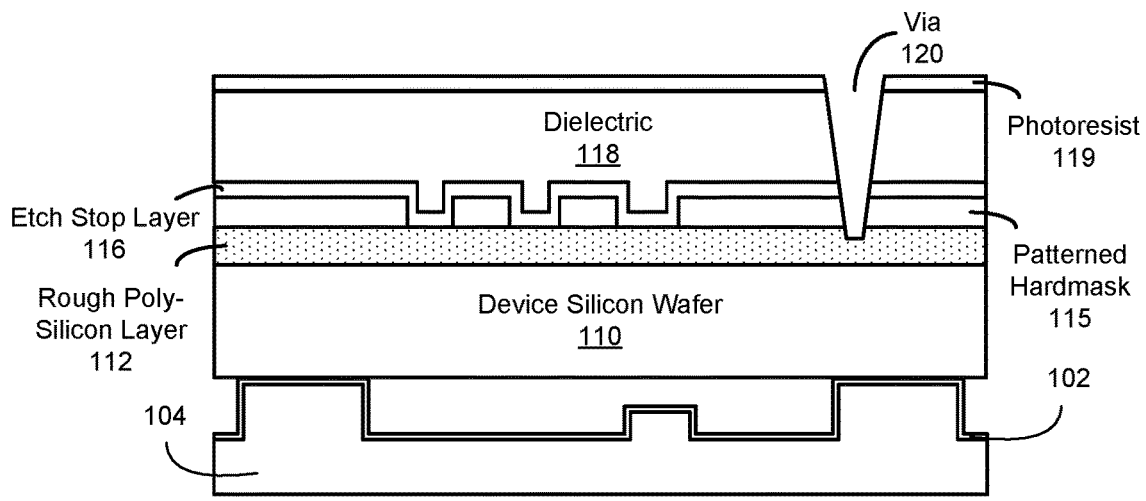
FIG. 7 shows the MEMS wafer after formation of a via therein according to one aspect of the present embodiments.

FIG. 7 shows the MEMS wafer after formation of a via therein according to one aspect of the present embodiments. The exposed portion of the dielectric 118 (uncovered by the photoresist 119) corresponds to the via that will be formed. As such, a via 120 is formed through the exposed portion of the dielectric 118, e.g., through lithography. In some embodiments, the via 120 extends through the etch stop layer 116. In some embodiments, the via 120 further extends through a portion of the rough polysilicon layer 112. It is appreciated that in some embodiments, the via 120 may extend to reach a top surface of the second side of the device silicon wafer 110.

Figure 8:
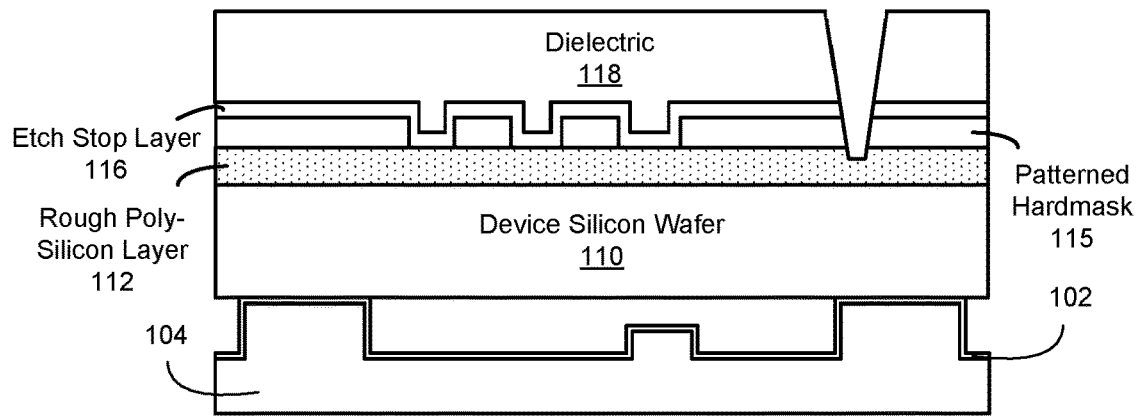
FIG. 8 shows the MEMS wafer after removal of the photoresist according to one aspect of the present embodiments.

FIG. 8 shows the MEMS wafer after removal of the photoresist according to one aspect of the present embodiments. After the via 120 is formed, the photoresist 119 is removed.

Figure 9:
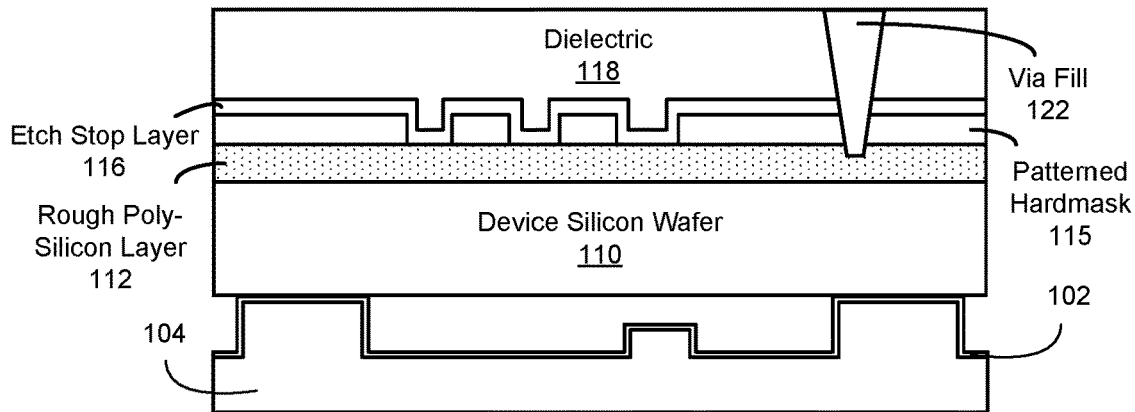
FIG. 9 shows the MEMS wafer after filling the via according to one aspect of the present embodiments.

FIG. 9 shows the MEMS wafer after filling the via according to one aspect of the present embodiments. The via 120 is filled with via fill 122, e.g., conductive material such as tungsten, copper, polysilicon, Titanium Nitride, etc., to provide electrical connection between the MEMS and a CMOS once eutecticly bonded to one another.

Figure 10:
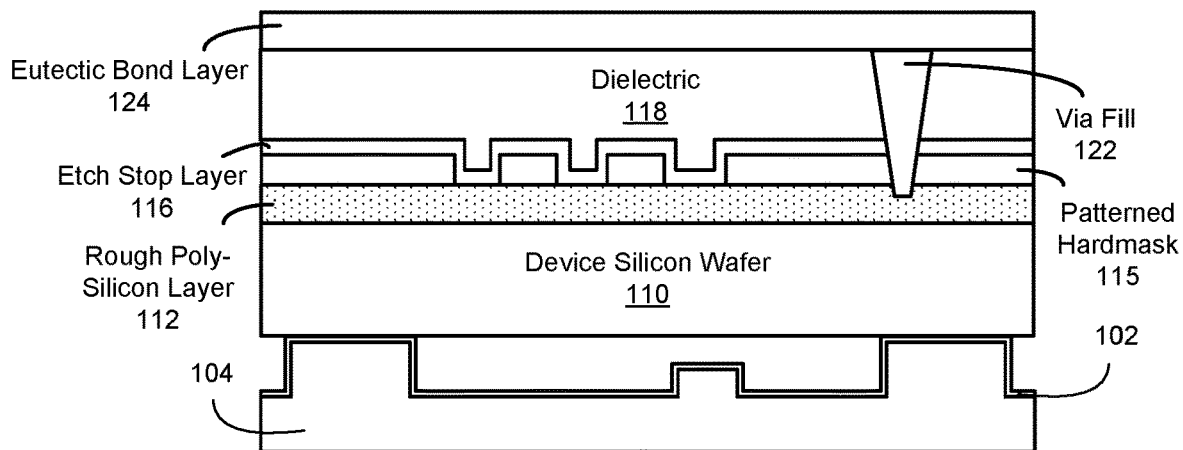
FIG. 10 shows the MEMS wafer after formation of a eutectic bond layer according to one aspect of the present embodiments.

FIG. 10 shows the MEMS wafer after formation of a eutectic bond layer according to one aspect of the present embodiments. A eutectic bond layer 124, e.g., Germanium, Aluminum, etc., may be deposited over a portion of the dielectric layer 118 and the via 120 that is filled with via filled 122. In some embodiments, the eutectic bond layer 124 is formed through a sputtering process.

Figure 11:
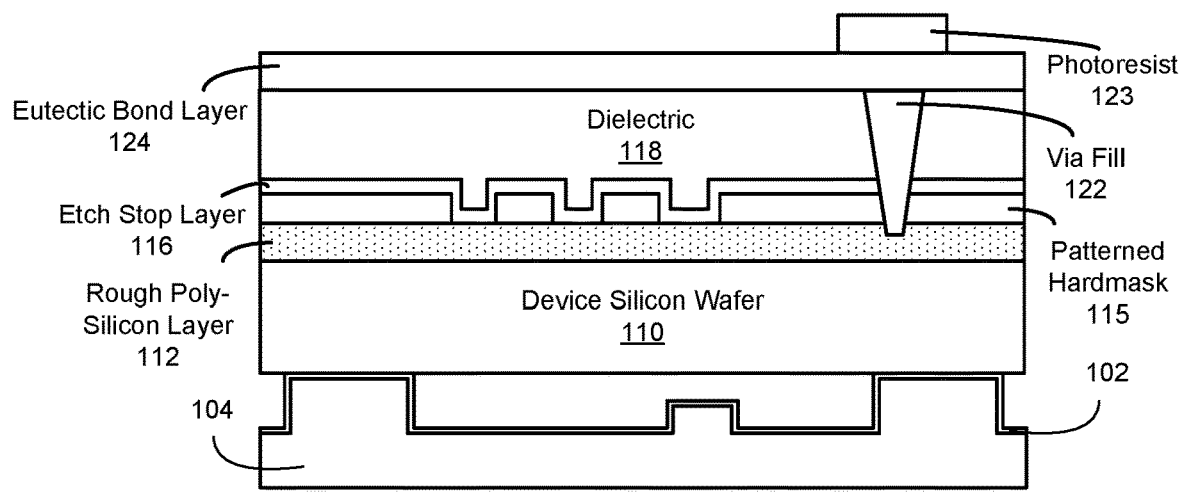
FIG. 11 shows the MEMS wafer after forming a photoresist layer over a eutectic bond layer according to one aspect of the present embodiments.

FIG. 11 shows the MEMS wafer after forming a photoresist layer over a eutectic bond layer according to one aspect of the present embodiments. A photoresist 123 is deposited/patterned to cover a portion of the eutectic bond layer 124 that corresponds to the standoff. In this embodiment, the photoresist 123 covers the via 120, the via filled 122, and a portion of the dielectric 118 in proximity and surrounding the via 120. The photoresist 123 layer protect the eutectic bond layer 124 that lies underneath.

Figure 12:
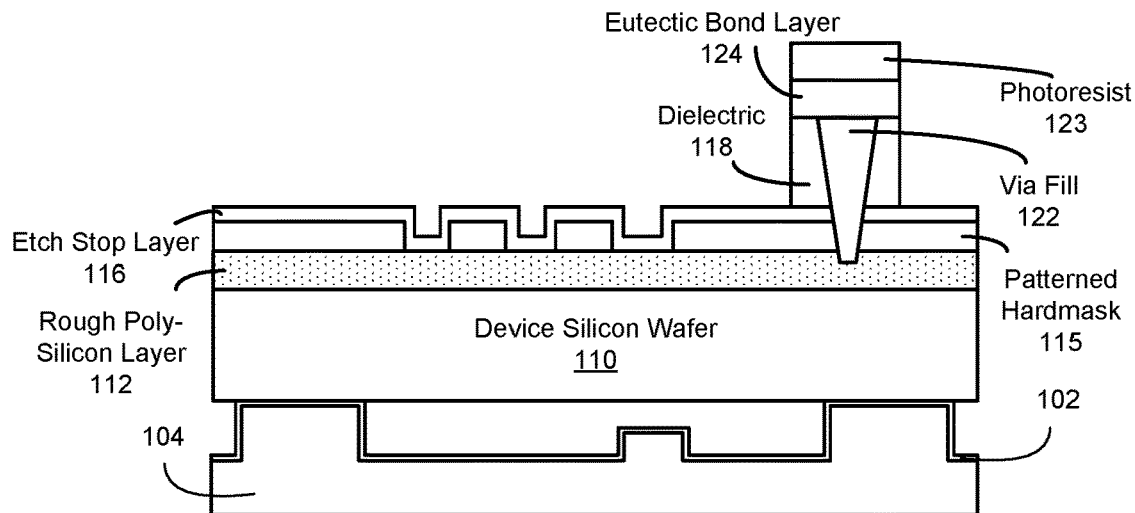
FIG. 12 shows the MEMS wafer after an etch process to expose the etch stop layer according to one aspect of the present embodiments.

FIG. 12 shows the MEMS wafer after an etch process to expose the etch stop layer according to one aspect of the present embodiments. The exposed portions of the eutectic bond layer 124 and the dielectric layer 118 underneath it are etched to expose the etch stop layer 116 underneath. In some embodiments, the eutectic bond layer 124 that is covered by the photoresist 123 remains in place while the exposed dielectric layer 118 (not covered by the photoresist 123) is etched and removed.

Figure 13:
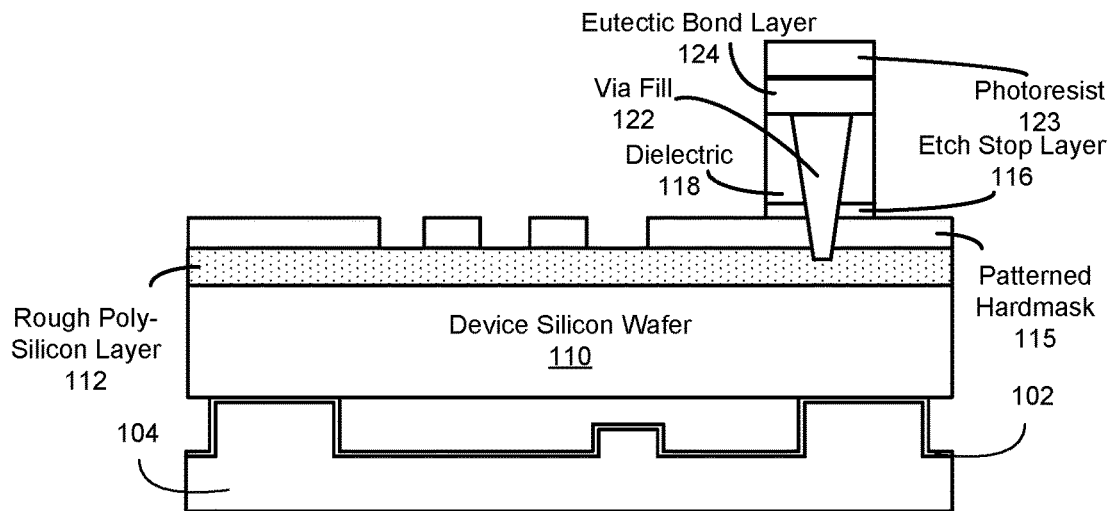
FIG. 13 shows the MEMS wafer after removal of the etch stop layer according to one aspect of the present embodiments.

FIG. 13 shows the MEMS wafer after removal of the etch stop layer according to one aspect of the present embodiments. The etch stop layer 116 that is exposed is removed to expose the patterned hardmask 115 underneath as well as the exposed portion of the rough polysilicon layer 112.

Figure 14:
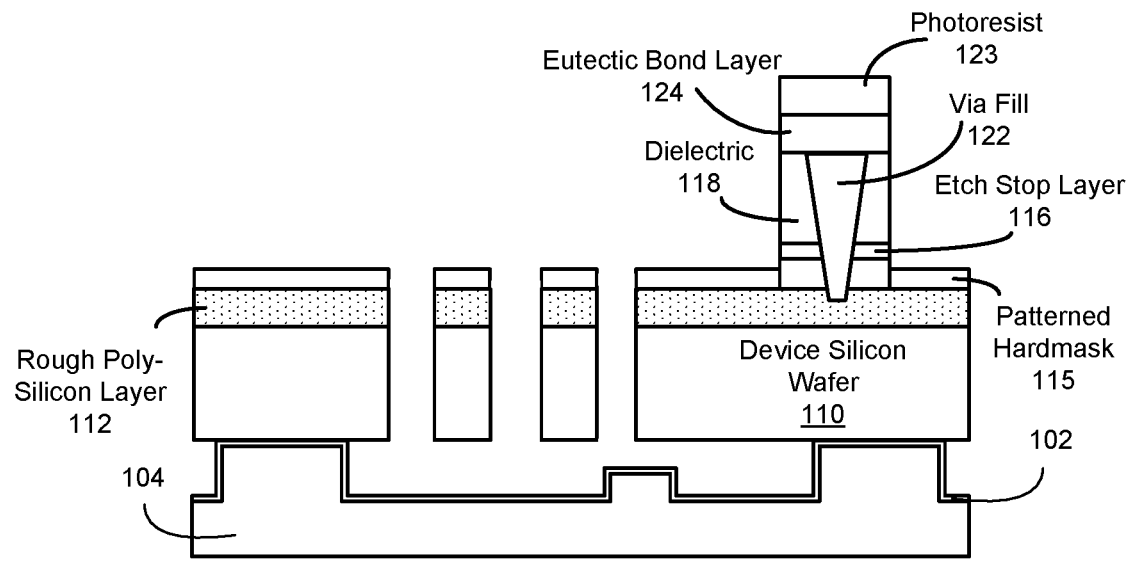
FIG. 14 shows the MEMS wafer after etching MEMS device pattern according to one aspect of the present embodiments.

FIG. 14 shows the MEMS wafer after etching MEMS device pattern according to one aspect of the present embodiments. MEMS device pattern corresponding to the device silicon wafer 110 and/or the rough polysilicon layer 112 that is not covered by the patterned hardmask 115 layer is etched. In other words, the exposed portions of the rough polysilicon layer 112 and/or the device silicon wafer 110 is etched to form the MEMS device pattern.

Figure 15:
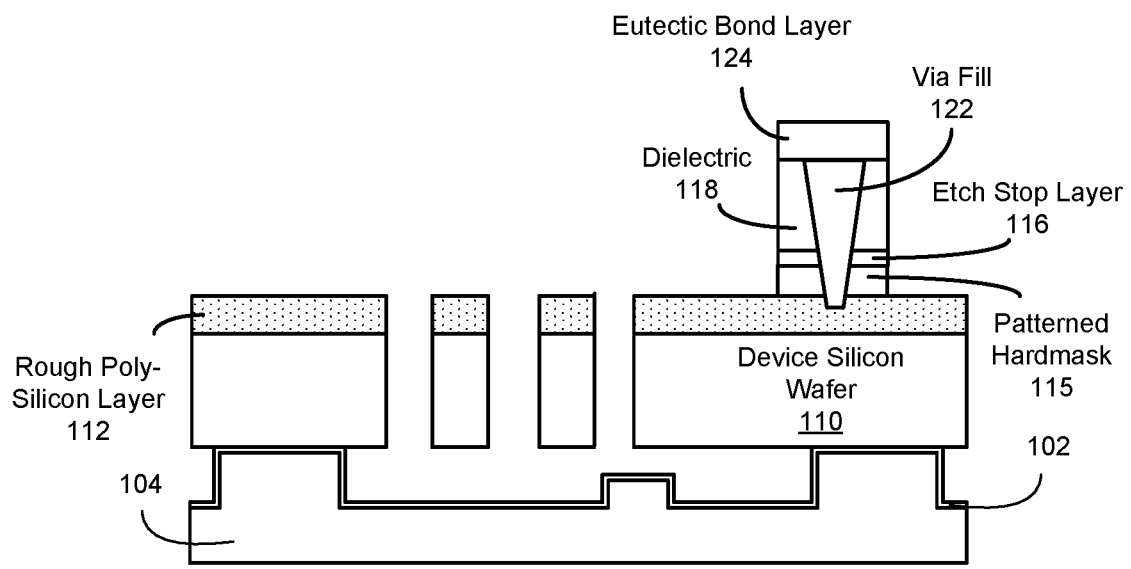
FIG. 15 shows the MEMS wafer after removing the patterned hard mask according to one aspect of the present embodiments.

FIG. 15 shows the MEMS wafer after removing the patterned hard mask according to one aspect of the present embodiments. The exposed patterned hardmask 115 is removed after forming the MEMS device pattern. In further steps (not shown), the standoffs (where the eutectic bond layer 124 and underlying layers reside) of the device silicon wafer 110 are eutecticly bonded to a CMOS wafer with eutectic bonds. In various embodiments, the eutectic bond metal 124 (e.g. germanium) on the standoffs may form the eutectic bonds with another eutectic bond metal (e.g. aluminum) on the CMOS wafer.

Figure 16:
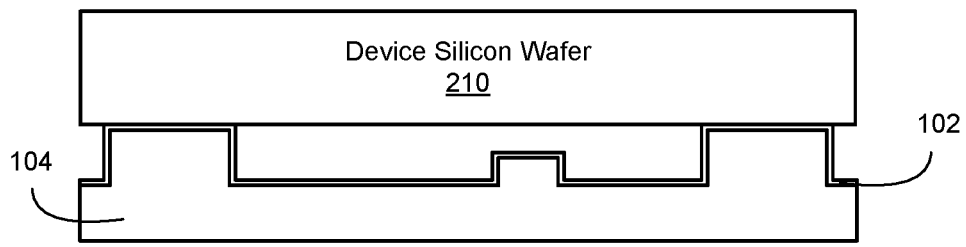
FIG. 16 shows a MEMS wafer at an early stage of manufacture according to one aspect of the present embodiments.

FIG. 16 shows a MEMS wafer at an early stage of manufacture according to one aspect of the present embodiments. In some embodiments, a fusion bond oxide 102 fusion bonds a handle silicon wafer 104 to a first side of a device silicon wafer 210 (may also be referred to as the actuator layer). A second side of the device silicon wafer 210 is planar and opposite the first side.

Figure 17:
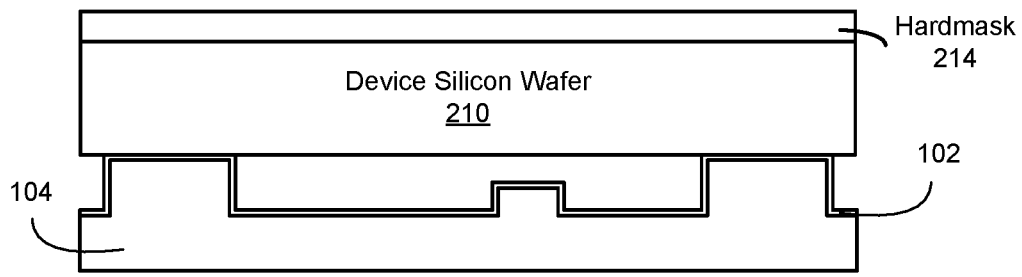
FIG. 17 shows the MEMS wafer after hardmask deposition according to one aspect of the present embodiments.

FIG. 17 shows the MEMS wafer after hardmask deposition according to one aspect of the present embodiments. A hardmask 214 is deposited on the second side of the device silicon wafer 210. In various embodiments the hardmask 214 includes oxide and is a different material than the device silicon wafer 210. In some embodiments, the hardmask 214 is deposited directly on the second side of the device silicon wafer 210.

Figure 18:
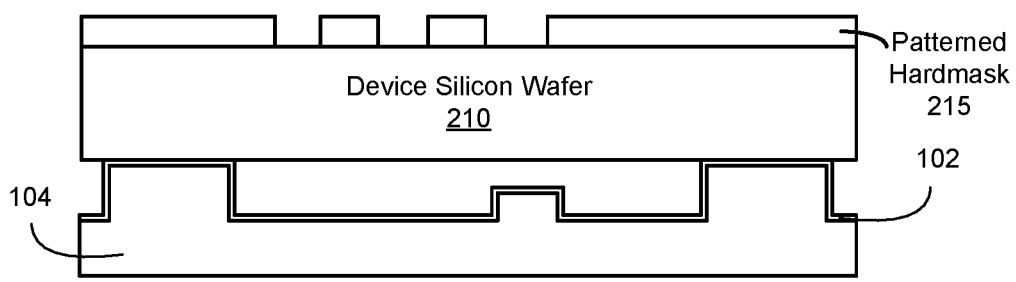
FIG. 18 shows the MEMS wafer after patterning the hardmask according to one aspect of the present embodiments.

FIG. 18 shows the MEMS wafer after patterning the hardmask according to one aspect of the present embodiments. The hardmask 214 is etched to form a patterned hardmask 215 that corresponds to MEMS device pattern. The etching of the hardmask 214 etches the full thickness of the hardmask 214, thereby exposing portions of the device silicon wafer 210.

Figure 19:
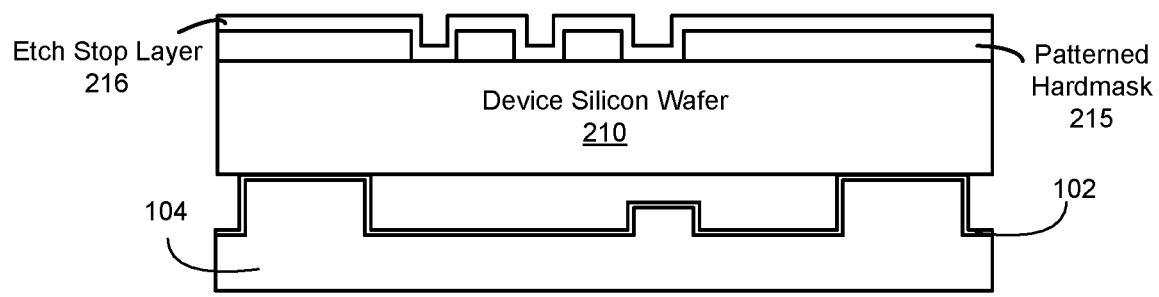
FIG. 19 shows the MEMS wafer after etch stop layer deposition according to one aspect of the present embodiments.

FIG. 19 shows the MEMS wafer after etch stop layer deposition according to one aspect of the present embodiments. An etch stop layer 216 is deposited over the patterned hardmask 215 and the exposed portions of the device silicon wafer 210. It is appreciated that use of the etch stop layer 216 may be eliminated by using a different material for the hardmask 214 layer and the standoff that is formed in a later stage (as discussed in other embodiments). It is appreciated that the etch stop layer 216 may include nitride, oxy-nitride, or poly-silicon.

Figure 20:
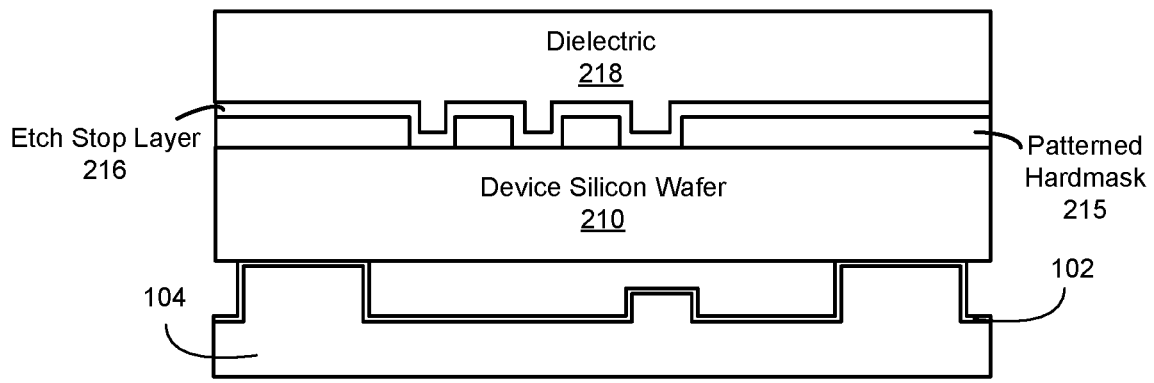
FIG. 20 shows the MEMS wafer after formation of a dielectric layer over the etch stop layer according to one aspect of the present embodiments.

FIG. 20 shows the MEMS wafer after formation of a dielectric layer over the etch stop layer according to one aspect of the present embodiments. A dielectric 218 is deposited over the etch stop layer 216. The dielectric 218 is used to form a standoff (discussed later below). The dielectric 218 may include a material similar to the hardmask 214. It is appreciated that as described above, the etch stop layer 216 may be eliminated if the hardmask 214 and the dielectric 218 are formed from different material (described in an embodiment later in this application). It is appreciated that the dielectric 218 may be deposited to form the standoff using plasma-enhanced chemical vapor deposition (PECVD)-oxide. In some embodiments, the dielectric 218 is optionally planarized through a chemical mechanical polishing process.

Figure 21:
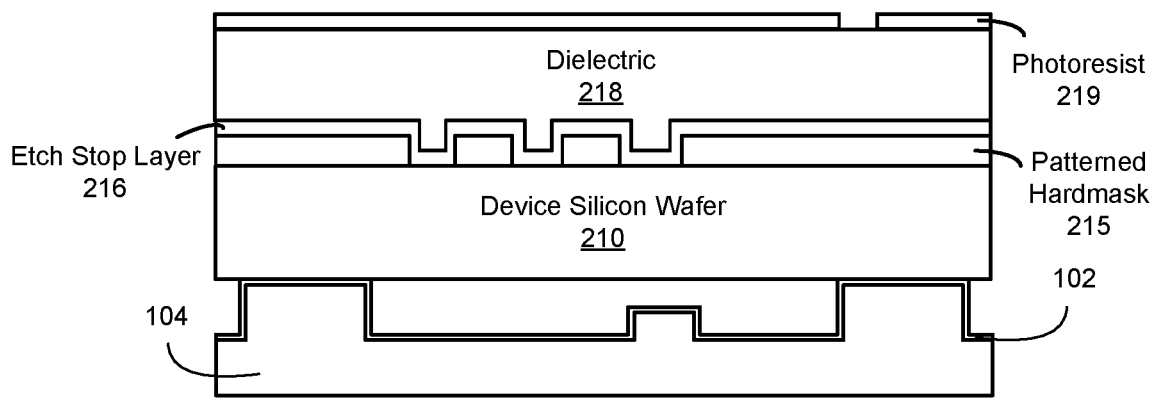
FIG. 21 shows the MEMS wafer after deposition of a photoresist over the dielectric layer according to one aspect of the present embodiments.

FIG. 21 shows the MEMS wafer after deposition of a photoresist over the dielectric layer according to one aspect of the present embodiments. A photoresist 219 is deposited over the dielectric 218 and patterned.

Figure 22:
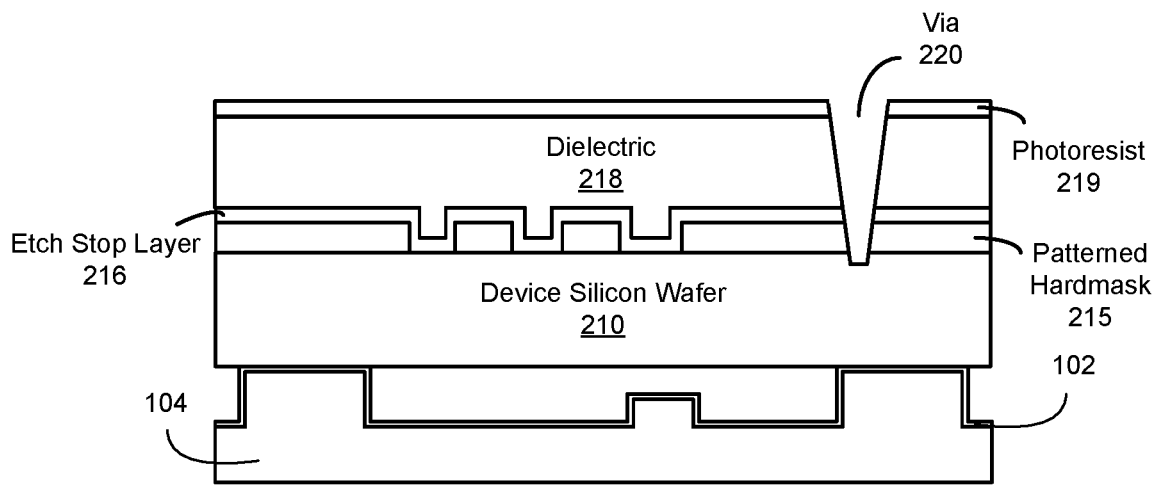
FIG. 22 shows the MEMS wafer after formation of a via therein according to one aspect of the present embodiments.

FIG. 22 shows the MEMS wafer after formation of a via therein according to one aspect of the present embodiments. The exposed portion of the dielectric 218 (uncovered by the photoresist 219) corresponds to the via that will be formed. As such, a via 220 is formed through the exposed portion of the dielectric 218, e.g., through lithography. In some embodiments, the via 220 extends through the etch stop layer 216. In some embodiments, the via 220 further extends through a portion of a top surface of the second side of the device silicon wafer 210.

Figure 23:
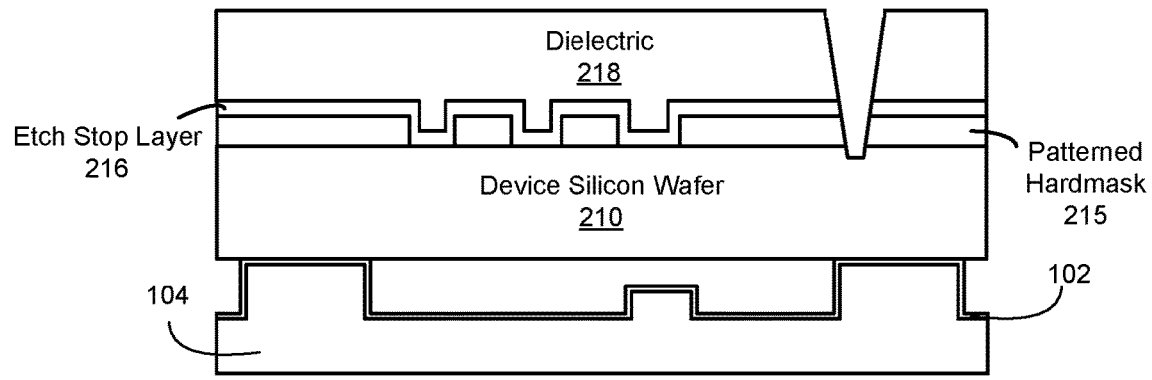
FIG. 23 shows the MEMS wafer after removal of the photoresist according to one aspect of the present embodiments.

FIG. 23 shows the MEMS wafer after removal of the photoresist according to one aspect of the present embodiments. After the via 220 is formed, the photoresist 219 is removed.

Figure 24:
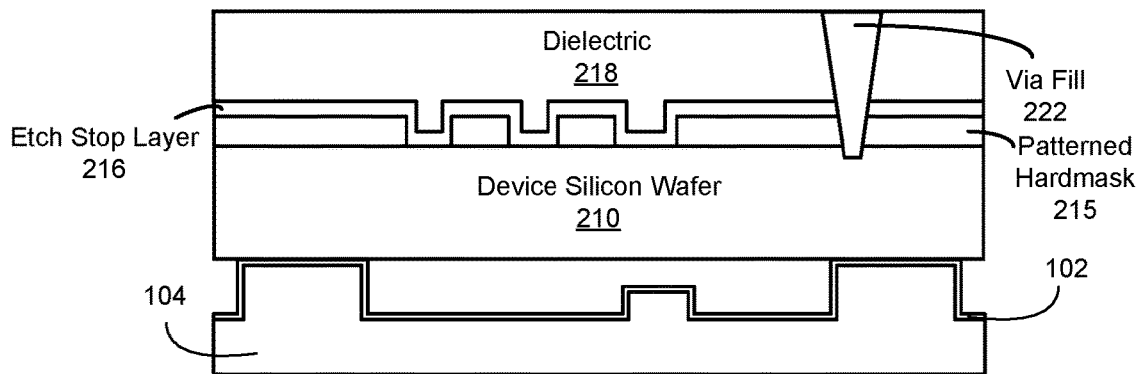
FIG. 24 shows the MEMS wafer after filling the via according to one aspect of the present embodiments.

FIG. 24 shows the MEMS wafer after filling the via according to one aspect of the present embodiments. The via 220 is filled with via fill 222, e.g., conductive material such as tungsten, copper, polysilicon, Titanium Nitride, etc., to provide electrical connection between the MEMS and a CMOS once eutecticly bonded to one another.

Figure 25:
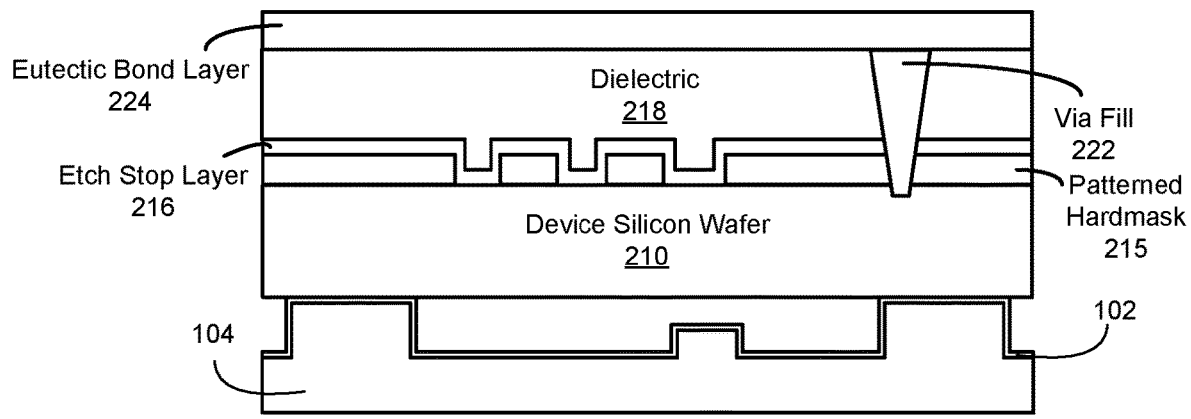
FIG. 25 shows the MEMS wafer after formation of a eutectic bond layer according to one aspect of the present embodiments.

FIG. 25 shows the MEMS wafer after formation of a eutectic bond layer according to one aspect of the present embodiments. A eutectic bond layer 224, e.g., Germanium, Aluminum, etc., may be deposited over a portion of the dielectric layer 218 and the via 220 that is filled with via filled 222. In some embodiments, the eutectic bond layer 224 is formed through a sputtering process.

Figure 26:
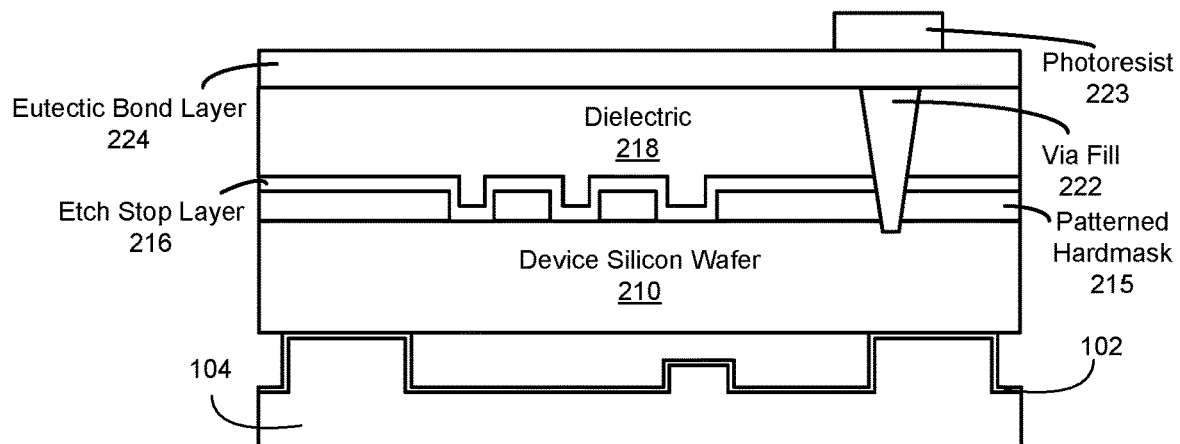
FIG. 26 shows the MEMS wafer after forming a photoresist layer over a eutectic bond layer according to one aspect of the present embodiments.

FIG. 26 shows the MEMS wafer after forming a photoresist layer over a eutectic bond layer according to one aspect of the present embodiments. A photoresist 223 is deposited/patterned to cover a portion of the eutectic bond layer 224 that corresponds to the standoff. In this embodiment, the photoresist 223 covers the via 220, the via filled 222, and a portion of the dielectric 218 in proximity and surrounding the via 220. The photoresist 223 layer protect the eutectic bond layer 224 that lies underneath.

Figure 27:
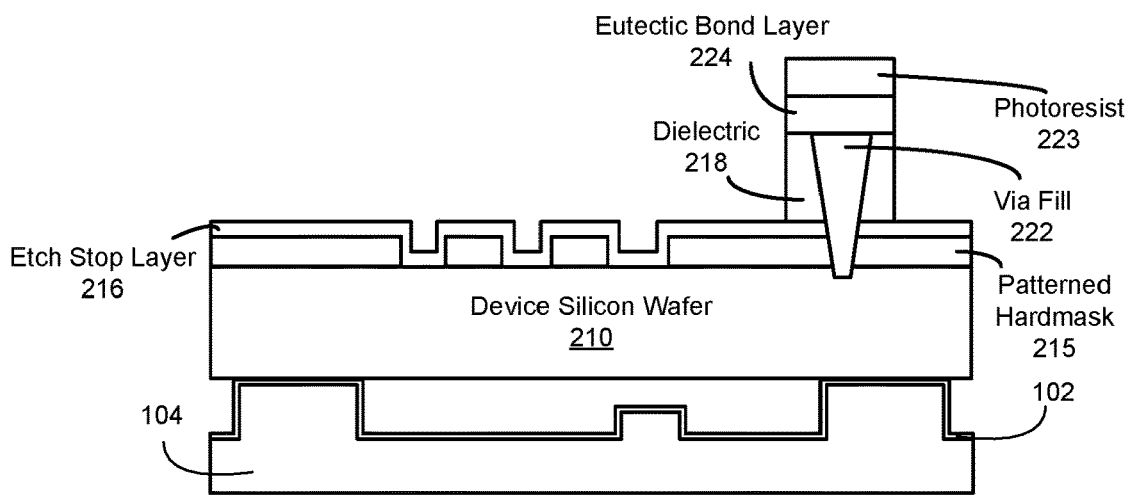
FIG. 27 shows the MEMS wafer after an etch process to expose the etch stop layer according to one aspect of the present embodiments.

FIG. 27 shows the MEMS wafer after an etch process to expose the etch stop layer according to one aspect of the present embodiments. The exposed portions of the eutectic bond layer 224 and the dielectric layer 218 underneath it are etched to expose the etch stop layer 216 underneath. In some embodiments, the eutectic bond layer 224 that is covered by the photoresist 223 remains in place while the exposed dielectric layer 218 (not covered by the photoresist 223) is etched and removed.

Figure 28:
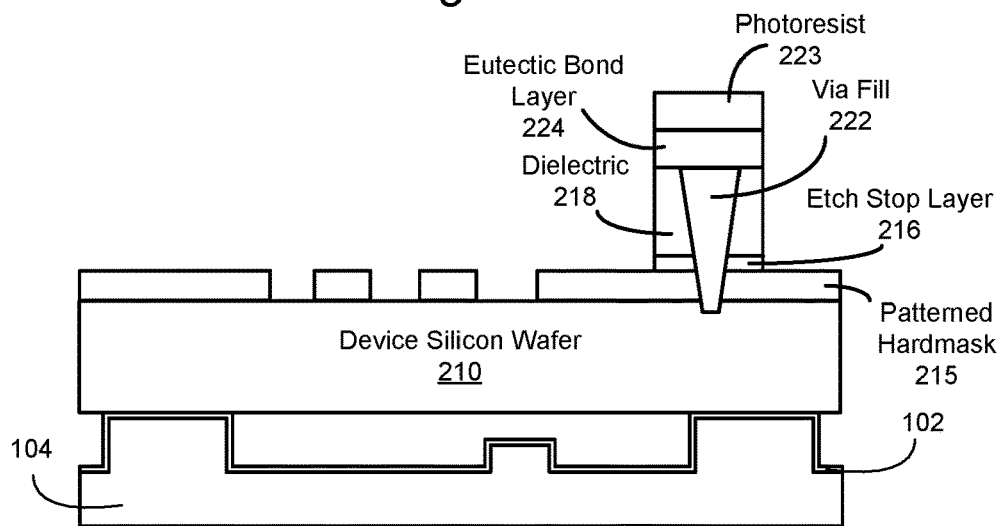
FIG. 28 shows the MEMS wafer after removal of the etch stop layer according to one aspect of the present embodiments.

FIG. 28 shows the MEMS wafer after removal of the etch stop layer according to one aspect of the present embodiments. The etch stop layer 216 that is exposed is removed to expose the patterned hardmask 215 underneath as well as the exposed portion of the device silicon wafer 210.

Figure 29:
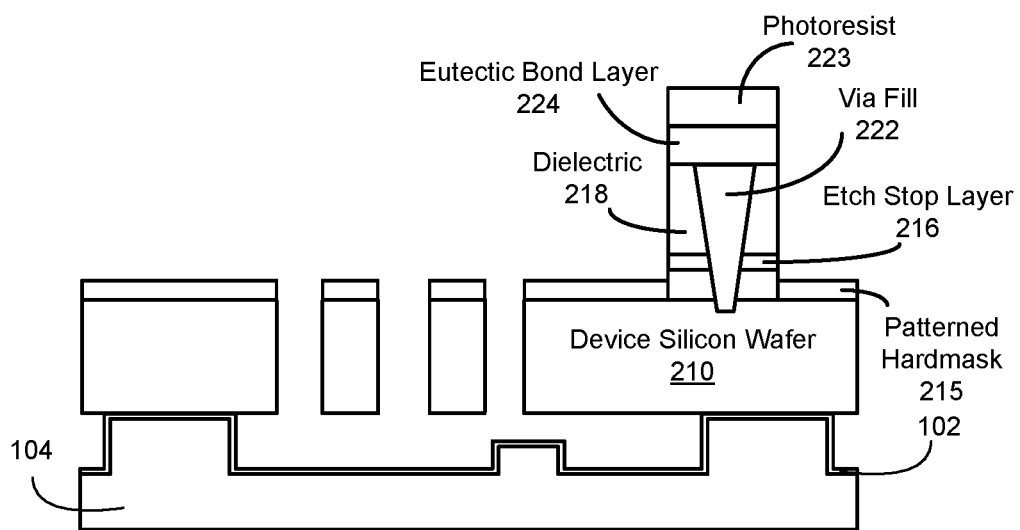
FIG. 29 shows the MEMS wafer after etching MEMS device pattern according to one aspect of the present embodiments.

FIG. 29 shows the MEMS wafer after etching MEMS device pattern according to one aspect of the present embodiments. MEMS device pattern corresponding to the device silicon wafer 210 that is not covered by the patterned hardmask 215 layer is etched. In other words, the exposed portions of the device silicon wafer 210 is etched to form the MEMS device pattern.

Figure 30:
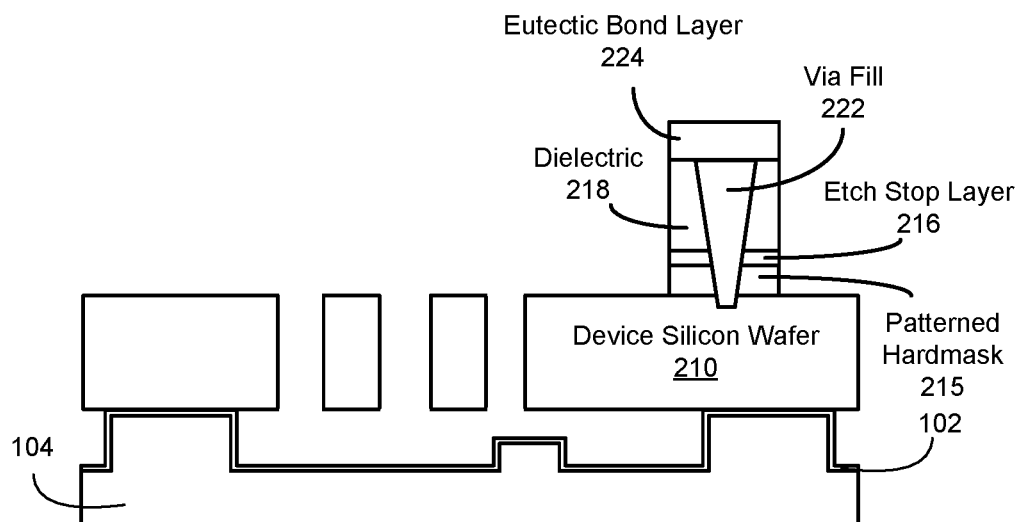
FIG. 30 shows the MEMS wafer after removing the patterned hard mask according to one aspect of the present embodiments.

FIG. 30 shows the MEMS wafer after removing the patterned hard mask according to one aspect of the present embodiments. The exposed patterned hardmask 215 is removed after forming the MEMS device pattern. In further steps (not shown), the standoffs (where the eutectic bond layer 224 and underlying layers reside) of the device silicon wafer 210 are eutecticly bonded to a CMOS wafer with eutectic bonds. In various embodiments, the eutectic bond metal 224 (e.g. germanium) on the standoffs may form the eutectic bonds with another eutectic bond metal (e.g. aluminum) on the CMOS wafer.

Figure 31:
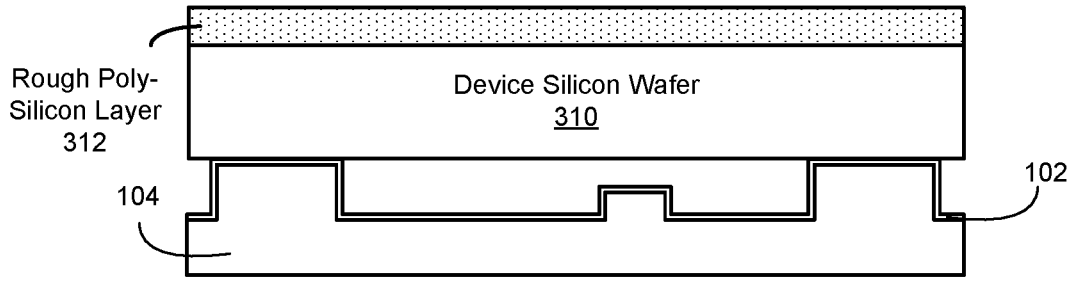
FIG. 31 shows a MEMS wafer at an early stage of manufacture according to one aspect of the present embodiments.

FIG. 31 shows a MEMS wafer at an early stage of manufacture according to one aspect of the present embodiments. In some embodiments, a fusion bond oxide 102 fusion bonds a handle silicon wafer 104 to a first side of a device silicon wafer 310 (may also be referred to as the actuator layer). A second side of the device silicon wafer 310 is planar and opposite the first side. In some embodiments, a rough polysilicon layer 312 is deposited on the second side of the device silicon wafer 310. In some embodiments, the rough polysilicon layer 312 is deposited directly on the second side of the device silicon wafer 310. It is appreciated that the rough polysilicon layer 312 is optional and it improves stiction. In other embodiments, the rough polysilicon layer 312 may be absent. It is appreciated that the rough polysilicon layer 312 may be substituted with a different material in order to improve stiction.

Figure 32:
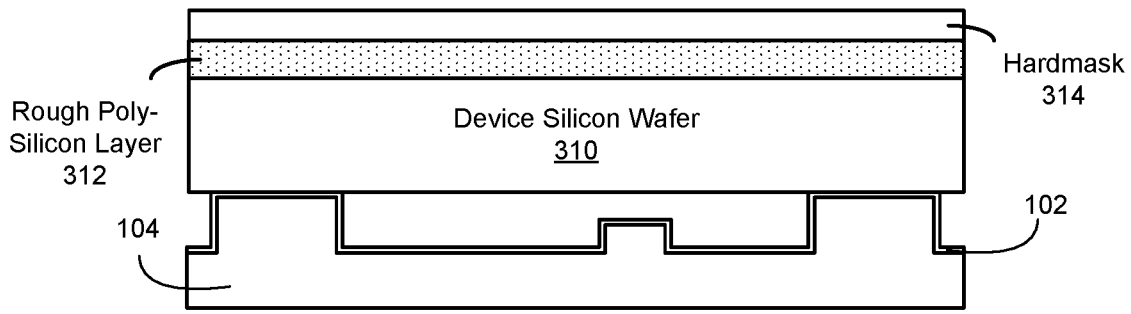
FIG. 32 shows the MEMS wafer after hardmask deposition according to one aspect of the present embodiments.

FIG. 32 shows the MEMS wafer after hardmask deposition according to one aspect of the present embodiments. A hardmask 314 is deposited on the second side of the device silicon wafer 310. In various embodiments the hardmask 314 includes oxide and is a different material than the device silicon wafer 110. In some embodiments, the hardmask 314 is deposited directly on the rough polysilicon layer 312 that covers the second side of the device silicon wafer 310.

Figure 33:
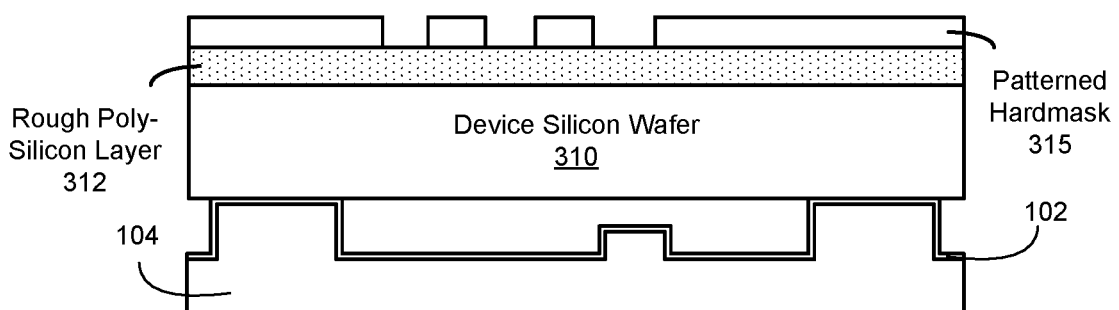
FIG. 33 shows the MEMS wafer after patterning the hardmask according to one aspect of the present embodiments.

FIG. 33 shows the MEMS wafer after patterning the hardmask according to one aspect of the present embodiments. The hardmask 314 is etched to form a patterned hardmask 315 that corresponds to MEMS device pattern. The etching of the hardmask 314 etches the full thickness of the hardmask 314, thereby exposing portions of the rough polysilicon layer 312.

Figure 34:
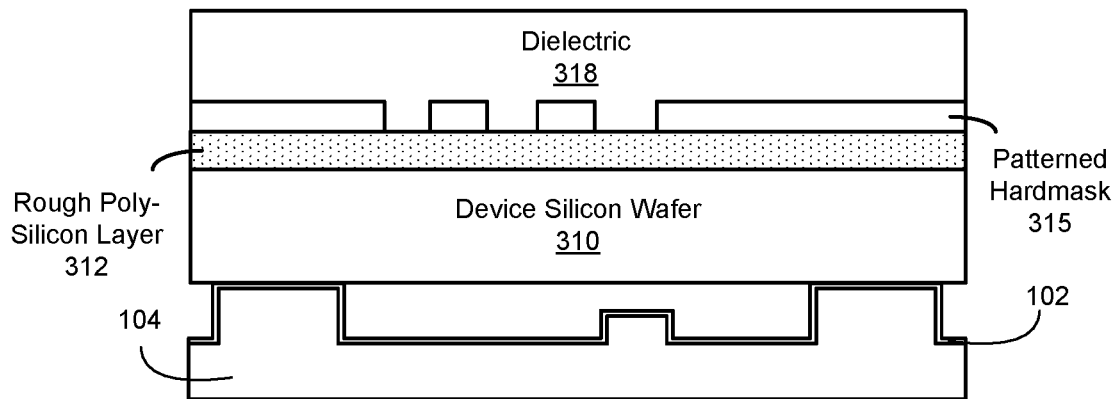
FIG. 34 shows the MEMS wafer after formation of a dielectric layer over the patterned hardmask according to one aspect of the present embodiments.

FIG. 34 shows the MEMS wafer after formation of a dielectric layer over the patterned hardmask according to one aspect of the present embodiments. A dielectric 318 is deposited over patterned hardmask 315 and the exposed portion of the rough polysilicon layer 312. The dielectric 318 is used to form a standoff (discussed later below). The dielectric 318 may include a material that is different from the hardmask 314, thereby eliminating the need to use an etch stop layer unlike previous embodiments. It is appreciated that the dielectric 318 may be deposited to form the standoff using plasma-enhanced chemical vapor deposition (PECVD)-oxide. In some embodiments, the dielectric 318 is optionally planarized through a chemical mechanical polishing process.

Figure 35:
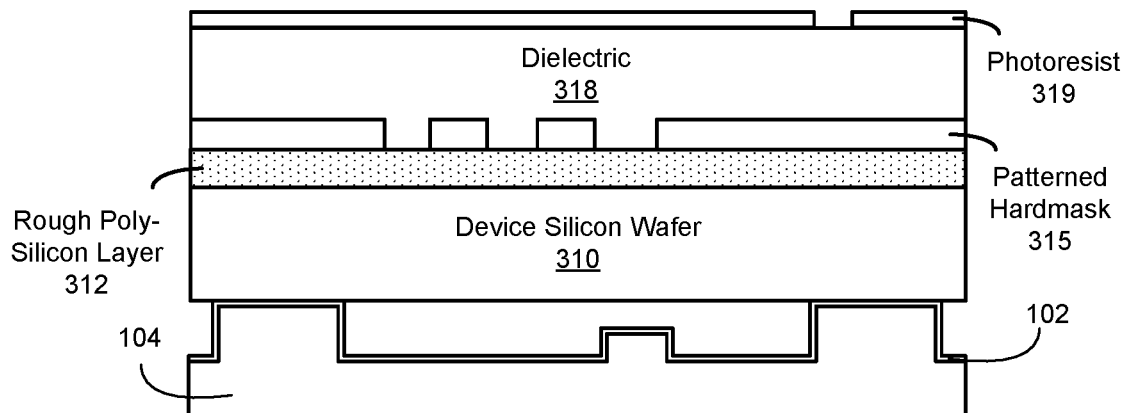
FIG. 35 shows the MEMS wafer after deposition of a photoresist over the dielectric layer according to one aspect of the present embodiments.

FIG. 35 shows the MEMS wafer after deposition of a photoresist over the dielectric layer according to one aspect of the present embodiments. A photoresist 319 is deposited over the dielectric 318 and patterned.

Figure 36:
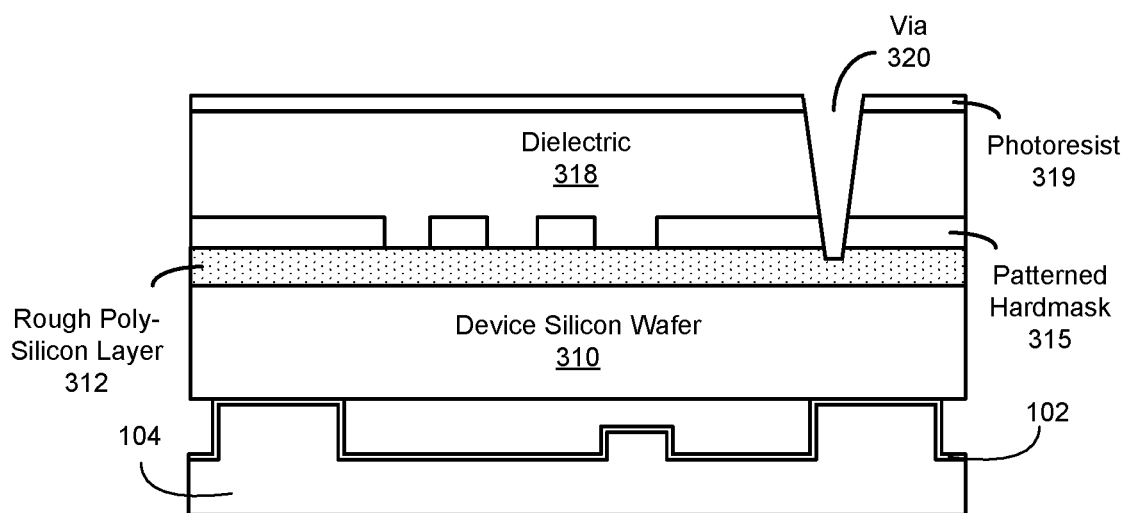
FIG. 36 shows the MEMS wafer after formation of a via therein according to one aspect of the present embodiments.

FIG. 36 shows the MEMS wafer after formation of a via therein according to one aspect of the present embodiments. The exposed portion of the dielectric 318 (uncovered by the photoresist 319) corresponds to the via that will be formed. As such, a via 320 is formed through the exposed portion of the dielectric 318, e.g., through lithography. In some embodiments, the via 320 extends through the patterned hardmask 315. In some embodiments, the via 320 further extends through a portion of the rough polysilicon layer 312. It is appreciated that in some embodiments, the via 320 may extend to reach a top surface of the second side of the device silicon wafer 310.

Figure 37:
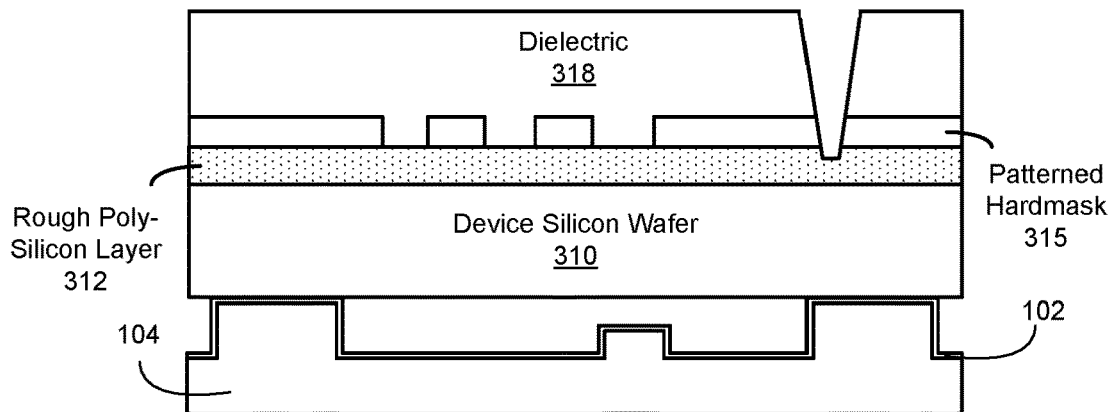
FIG. 37 shows the MEMS wafer after removal of the photoresist according to one aspect of the present embodiments.

FIG. 37 shows the MEMS wafer after removal of the photoresist according to one aspect of the present embodiments. After the via 320 is formed, the photoresist 319 is removed.

Figure 38:
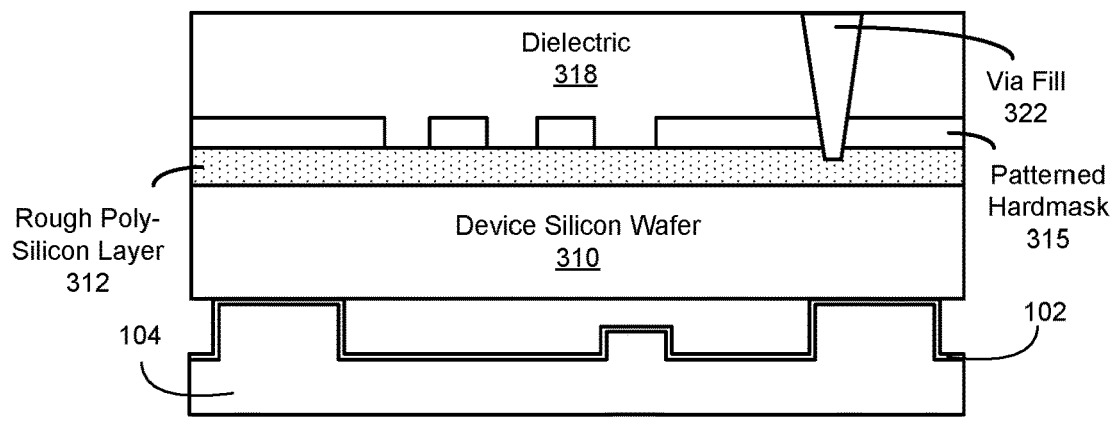
FIG. 38 shows the MEMS wafer after filling the via according to one aspect of the present embodiments.

FIG. 38 shows the MEMS wafer after filling the via according to one aspect of the present embodiments. The via 320 is filled with via fill 322, e.g., conductive material such as tungsten, copper, polysilicon, Titanium Nitride, etc., to provide electrical connection between the MEMS and a CMOS once eutecticly bonded to one another.

Figure 39:
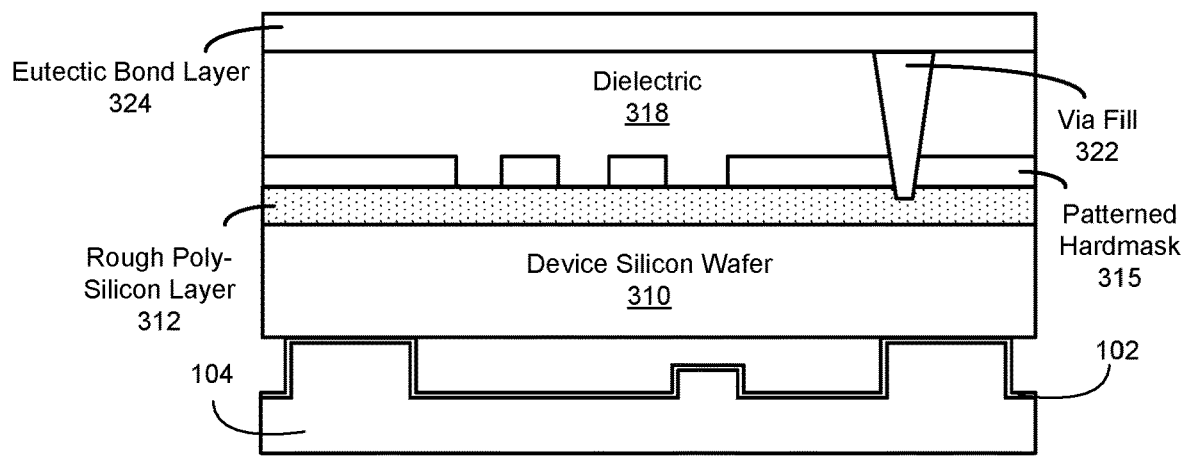
FIG. 39 shows the MEMS wafer after formation of a eutectic bond layer according to one aspect of the present embodiments.

FIG. 39 shows the MEMS wafer after formation of a eutectic bond layer according to one aspect of the present embodiments. A eutectic bond layer 324, e.g., Germanium, Aluminum, etc., may be deposited over a portion of the dielectric layer 318 and the via 320 that is filled with via filled 322. In some embodiments, the eutectic bond layer 324 is formed through a sputtering process.

Figure 40:
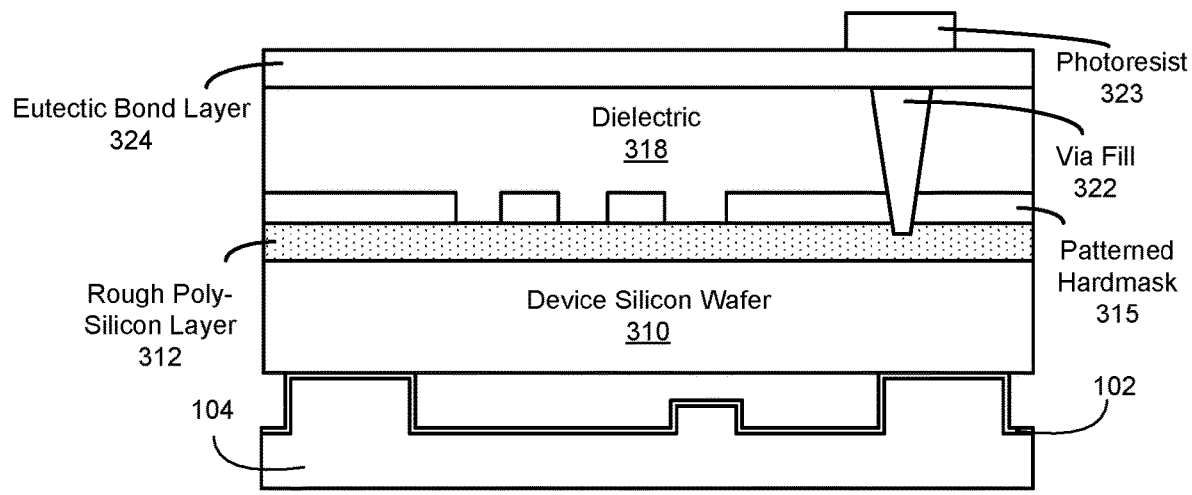
FIG. 40 shows the MEMS wafer after forming a photoresist layer over a eutectic bond layer according to one aspect of the present embodiments.

FIG. 40 shows the MEMS wafer after forming a photoresist layer over a eutectic bond layer according to one aspect of the present embodiments. A photoresist 323 is deposited/patterned to cover a portion of the eutectic bond layer 324 that corresponds to the standoff. In this embodiment, the photoresist 323 covers the via 320, the via filled 322, and a portion of the dielectric 318 in proximity and surrounding the via 320. The photoresist 323 layer protect the eutectic bond layer 324 that lies underneath.

Figure 41:
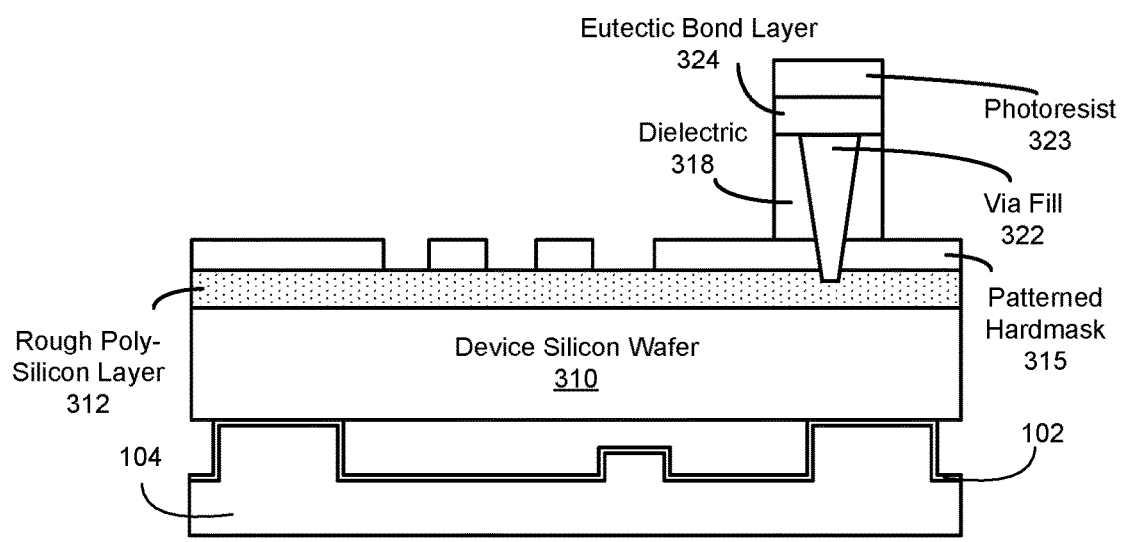
FIG. 41 shows the MEMS wafer after an etch process to expose the patterned hardmask according to one aspect of the present embodiments.

FIG. 41 shows the MEMS wafer after an etch process to expose the patterned hardmask according to one aspect of the present embodiments. The exposed portions of the eutectic bond layer 324 and the dielectric layer 318 underneath it are etched to expose the patterned hardmask 315 layer underneath. In some embodiments, the eutectic bond layer 324 that is covered by the photoresist 323 remains in place while the exposed dielectric layer 318 (not covered by the photoresist 323) is etched and removed.

Figure 42:
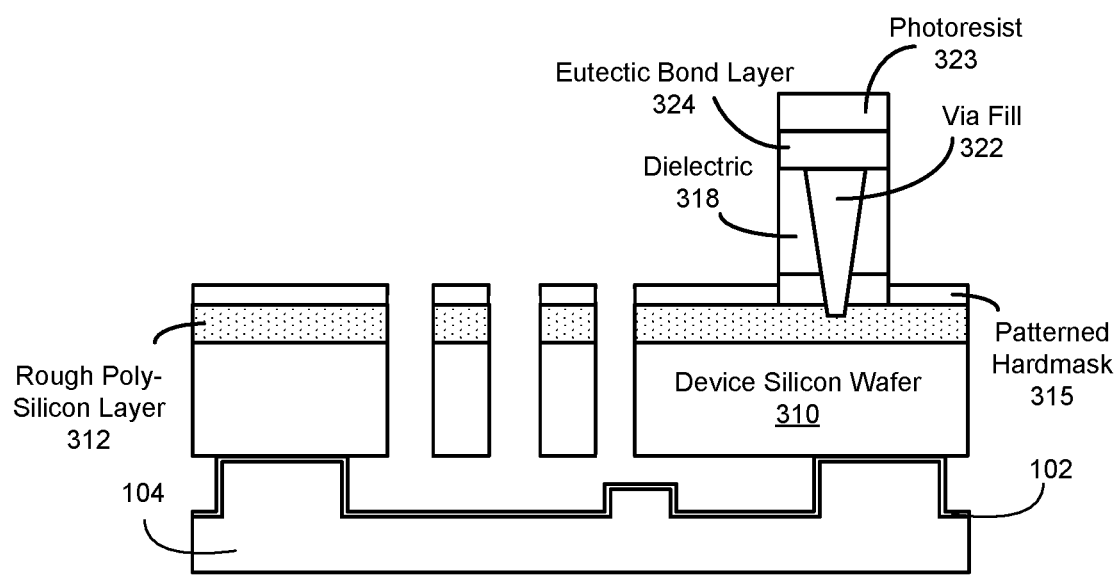
FIG. 42 shows the MEMS wafer after etching MEMS device pattern according to one aspect of the present embodiments.

FIG. 42 shows the MEMS wafer after etching MEMS device pattern according to one aspect of the present embodiments. MEMS device pattern corresponding to the device silicon wafer 310 and/or the rough polysilicon layer 312 that is not covered by the patterned hardmask 315 layer is etched. In other words, the exposed portions of the rough polysilicon layer 312 and/or the device silicon wafer 310 is etched to form the MEMS device pattern.

Figure 43:
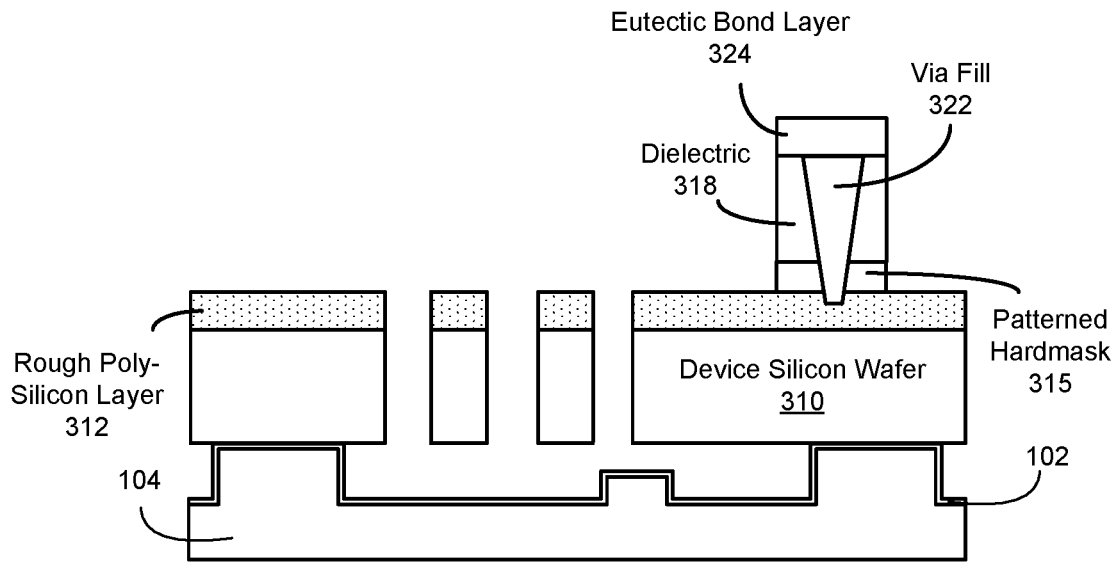
FIG. 43 shows the MEMS wafer after removing the patterned hard mask according to one aspect of the present embodiments.

FIG. 43 shows the MEMS wafer after removing the patterned hard mask according to one aspect of the present embodiments. The exposed patterned hardmask 315 is removed after forming the MEMS device pattern. In further steps (not shown), the standoffs (where the eutectic bond layer 324 and underlying layers reside) of the device silicon wafer 310 are eutecticly bonded to a CMOS wafer with eutectic bonds. In various embodiments, the eutectic bond metal 324 (e.g. germanium) on the standoffs may form the eutectic bonds with another eutectic bond metal (e.g. aluminum) on the CMOS wafer.

Figure 44:
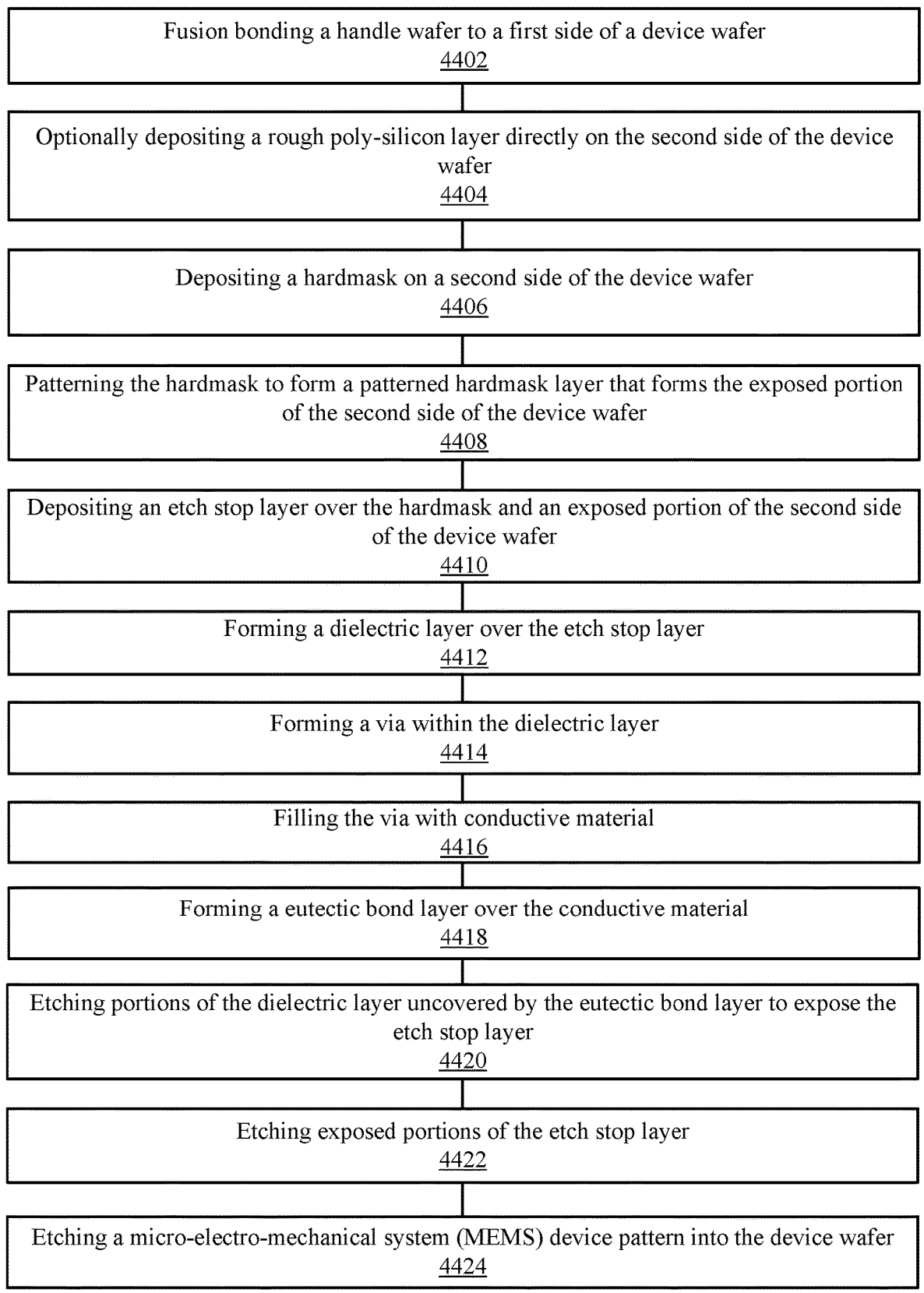
FIG. 44 shows an exemplary flow diagram for actuator layer patterning with topography according to one aspect of the present embodiments.

FIG. 44 shows an exemplary flow diagram for actuator layer patterning with topography according to one aspect of the present embodiments. The flow diagram corresponds to FIGS. 1-30, as described above. At step 4402, a handle wafer is fusion bonded to a first side of a device wafer. At optional step 4404, a rough polysilicon layer is deposited directly on the second side of the device wafer. At step 4406, a hardmask is deposited on a second side of the device wafer. At step 4408, the hardmask is patterned to form an exposed portion on the second side of the device wafer. At step 4410, an etch stop layer is deposited over the hardmask and an exposed portion of the second side of the device wafer. At step 4412, a dielectric layer is formed over the etch stop layer. At step 4414, a via is formed within the dielectric layer. At step 4416, the via is filled with conductive material. At step 4418, a eutectic bond layer is formed over the conductive material. It is appreciated that in some embodiments, the eutectic bond layer is deposited over the dielectric layer and the via and is subsequently patterned and etched. At step 4420, a portion of the dielectric layer uncovered by the eutectic bond layer is etched to expose the etch stop layer. At step 4422, an exposed portions of the etch stop layer is etched/removed. At step 4424, a MEMS device pattern is etched into the device wafer. In some embodiments, the remaining exposed hardmask is removed.

Figure 45:
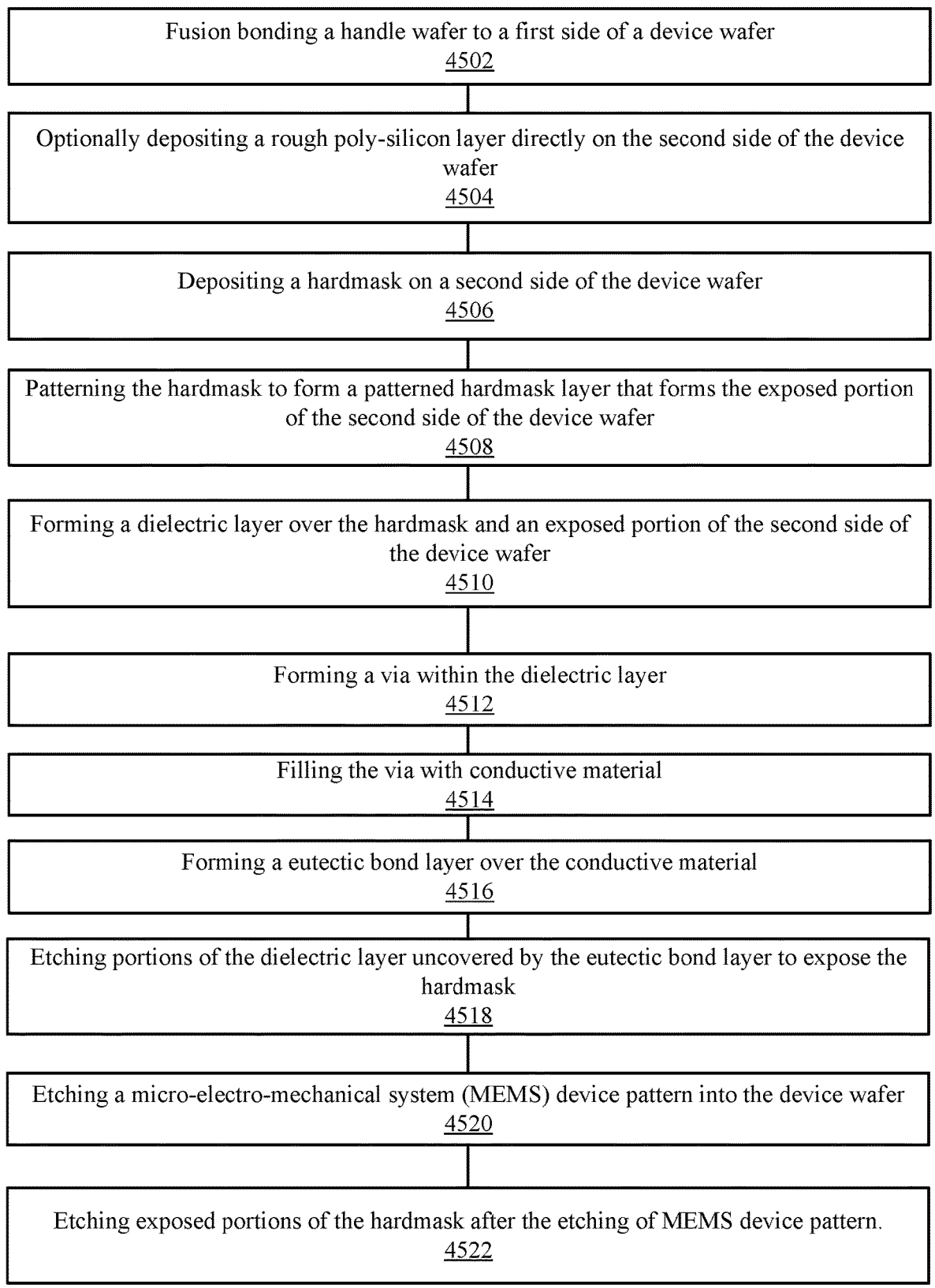
FIG. 45 shows another exemplary flow diagram for actuator layer patterning with topography according to one aspect of the present embodiments.

FIG. 45 shows another exemplary flow diagram for actuator layer patterning with topography according to one aspect of the present embodiments. The flow diagram corresponds to FIGS. 31-43, as described above. At step 4502, a handle wafer is fusion bonded to a first side of a device wafer. At optional step 4504, a rough polysilicon layer is deposited directly on the second side of the device wafer. At step 4506, a hardmask is deposited on a second side of the device wafer. At step 4508, the hardmask is patterned to form an exposed portion on the second side of the device wafer. At step 4510, a dielectric layer is formed over the hardmask and the exposed portion of the device wafer and/or the rough polysilicon layer. At step 4512, a via is formed within the dielectric layer. At step 4514, the via is filled with conductive material. At step 4516, a eutectic bond layer is formed over the conductive material. It is appreciated that in some embodiments, the eutectic bond layer is deposited over the dielectric layer and the via and is subsequently patterned and etched. At step 4518, a portion of the dielectric layer uncovered by the eutectic bond layer is etched to expose the hardmask layer. At step 4520, an exposed portions of the device silicon wafer is etched to form MEMS device pattern. At step 4522, an exposed portions of the hardmask is etched/removed.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   fusion bonding a handle wafer to a first side of a device wafer;
   depositing a hardmask on a second side of the device wafer, wherein the second side is planar;
   depositing an etch stop layer over the hardmask and an exposed portion of the second side of the device wafer;
   forming a dielectric layer over the etch stop layer;
   forming a via within the dielectric layer;
   filling the via with conductive material;
   forming a eutectic bond layer over the conductive material;
   etching portions of the dielectric layer uncovered by the eutectic bond layer to expose the etch stop layer;
   etching exposed portions of the etch stop layer; and
   etching a micro-electro-mechanical system (MEMS) device pattern into the device wafer.

2. The method of claim 1, further comprising depositing a rough poly-silicon layer directly on the second side of the device wafer, and wherein the hardmask is deposited directly on the rough poly-silicon layer.

3. The method of claim 2, wherein the via extends into the rough poly-silicon layer.

4. The method of claim 1 further comprising patterning the hardmask to form a patterned hardmask layer that forms the exposed portion of the second side of the device wafer.

5. The method of claim 4, wherein the MEMS pattern corresponds to patterned hardmask layer.

6. The method of claim 1, wherein the etch stop layer comprises nitride, oxy-nitride, or poly-silicon.

7. The method of claim 1, wherein the eutectic bond layer comprises Ge.

8. The method of claim 1, wherein the conductive material comprises tungsten, copper, poly-silicon, or Titanium Nitride.

9. The method of claim 1 further comprising etching exposed portions of the hardmask after the etching of MEMS device pattern.

10. A method comprising:
    fusion bonding a handle wafer to a first side of a device wafer;
    depositing a hardmask on a second side of the device wafer, wherein the second side is planar;
    forming a dielectric layer over the hardmask and an exposed portion of the second side of the device wafer;
    forming a via within the dielectric layer;
    filling the via with conductive material;
    forming a eutectic bond layer over the conductive material;
    etching portions of the dielectric layer uncovered by the eutectic bond layer to expose the hardmask; and
    etching a micro-electro-mechanical system (MEMS) device pattern into the device wafer.

11. The method of claim 10, further comprising depositing a rough poly-silicon layer directly on the second side of the device wafer, and wherein the hardmask is deposited directly on the rough poly-silicon layer.

12. The method of claim 11, wherein the via extends into the rough poly-silicon layer.

13. The method of claim 10 further comprising patterning the hardmask to form a patterned hardmask layer that forms the exposed portion of the second side of the device wafer.

14. The method of claim 10, wherein the eutectic bond layer comprises Ge.

15. The method of claim 10, wherein the conductive material comprises tungsten, copper, poly-silicon, or Titanium Nitride.

16. The method of claim 10 further comprising etching exposed portions of the hardmask after the etching of MEMS device pattern.

* * * * *